(12) United States Patent
Igusa et al.

(10) Patent No.: US 6,249,902 B1
(45) Date of Patent: Jun. 19, 2001

(54) DESIGN HIERARCHY-BASED PLACEMENT

(75) Inventors: Mitsuru Igusa, Los Gatos; Hsi-Chuan Chen, Fremont; Shiu-Ping Chao, Los Altos; Wei-Jin Dai, Cupertino; Daw Yang Shyong, San Jose, all of CA (US)

(73) Assignee: Silicon Perspective Corporation, Santa Clara, CA (US)

(*) Notice: Subject to any disclaimer, the term of this patent is extended or adjusted under 35 U.S.C. 154(b) by 0 days.

(21) Appl. No.: 09/005,361

(22) Filed: Jan. 9, 1998

(51) Int. Cl.⁷ .................................................. G06F 17/50
(52) U.S. Cl. .................................. 716/10; 716/1; 716/2; 716/7; 716/10; 716/11; 716/12
(58) Field of Search ............................. 395/500.1; 716/1, 716/10

(56) References Cited

U.S. PATENT DOCUMENTS

| | | | |
|---|---|---|---|
| 4,577,276 | * 3/1986 | Dunlop et al. ........................ | 364/491 |
| 4,758,953 | * 7/1988 | Morita et al. ......................... | 364/300 |
| 5,175,693 | * 12/1992 | Kurosawa et al. ................... | 364/491 |
| 5,311,443 | * 5/1994 | Crain et al. .......................... | 364/491 |
| 5,485,396 | * 1/1996 | Brasen et al. ........................ | 364/491 |
| 5,513,119 | * 4/1996 | Moore et al. ........................ | 364/491 |
| 5,604,680 | * 2/1997 | Bamji et al. ......................... | 364/491 |
| 5,636,125 | * 6/1997 | Rostoker et al. ............... | 364/468.28 |
| 5,644,496 | * 7/1997 | Agrawal et al. ..................... | 364/489 |
| 5,659,717 | * 8/1997 | Tse et al. ............................. | 395/500 |
| 5,661,663 | * 8/1997 | Scepanovic et al. ................ | 364/491 |
| 5,666,289 | * 9/1997 | Watkins ............................... | 364/491 |
| 5,682,321 | * 10/1997 | Ding et al. ........................... | 364/490 |
| 5,682,322 | * 10/1997 | Boyle ................................... | 364/491 |
| 5,699,265 | * 12/1997 | Scepanovic et al. ................ | 364/491 |
| 5,784,289 | * 7/1998 | Wang ................................... | 364/490 |
| 5,838,585 | * 11/1998 | Scepanovic et al. ................ | 364/491 |
| 5,854,752 | * 12/1998 | Agarwal ............................... | 364/489 |
| 5,909,376 | * 6/1999 | Scepanovic et al. ................ | 364/491 |
| 5,930,499 | * 7/1999 | Chen et al. ..................... | 395/500.09 |
| 5,940,604 | * 8/1999 | Merryman et al. ............. | 395/500.03 |

OTHER PUBLICATIONS

Yu–Wen Tsay et al., A Cell Placement Procedure that Utilizes Circuit Structural Properties, Proceedings of the European Conference on Design Automation, pp. 189–193, Feb. 1993.*

W. Kim et al., An Improved Hierarchical Placement Technique Using Clustering & Region Refinement, 1996 IEEE Asia Pacific Conference on Circuits and Systems, pp. 393–396, Jun. 1996.*

Yang, Yil et al., HALO: an efficient global placement strategy for standard cells, Circuits and Systems, 1990., IEEE International Symposium on, pp. 448–451, May, 1990.*

(List continued on next page.)

Primary Examiner—Matthew Smith
Assistant Examiner—A. M. Thompson
(74) Attorney, Agent, or Firm—Smith-Hill and Bedell

(57) ABSTRACT

In computer-aided electronic design automation software, a placement system biases clustering of cells according to their hierarchical design while optimizing placement for controlling die size and total wire length. The placement system also provides for slack distribution, row improvement and randomization during partitioning. Floor plans based on trial placement and placement guiding blocks are also described.

15 Claims, 14 Drawing Sheets

OTHER PUBLICATIONS

Yang, Yeong–Yil, HALO: an efficient global placement strategy for standard cells, Computer–Aided Design of Integrated Circuits and Systems, IEEE Transactions on, pp. 1024–1031, Aug. 1992.*

Hamad, Yakeo et al., An Efficient Multilevel Placement Technique Using Hierarchical Partitioning, Circuits and Systems I: Fundamental Theory and Applications, IEEE Transactions on, pp. 432–439, Jun. 1992.*

Pedram, M. et al., Floorplanning with Pin Assignment, Proc. Int. Conf. Computer–Aided Design, IEEE, pp. 98–101, Sep. 1990.*

Choy et al, An Algorithm to Deal With Incremental Layout Alteration, IEEE, pp. 850–853, Aug. 1992.*

Sun, Wern–Jieh et al., Efficient and Effective Placement for Very Large Circuits, IEEE Transactions on Computer–Aided Design of Integrated Circuits and Systems, pp. 349–359, Mar. 1995.*

Wei, Yen–Chuen et al., Towards efficient hierarchical designs by ratio cut partitioning, Computer–Aided Design, 1989. ICCAD–89, pp. 298–301, Nov. 1989.*

* cited by examiner

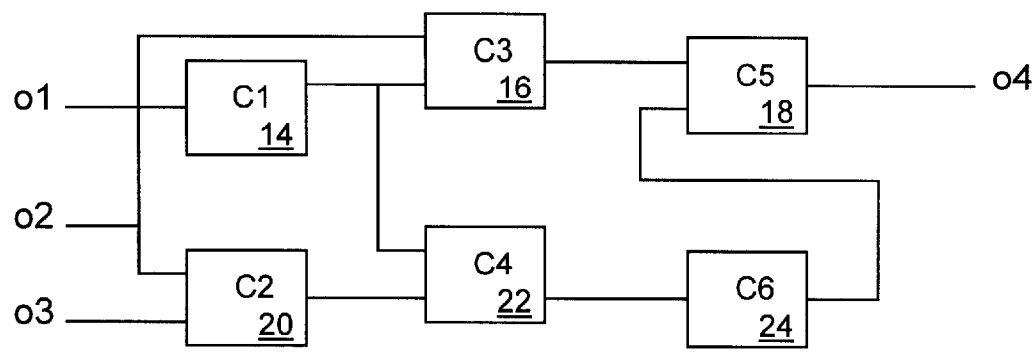
FIG. 2A
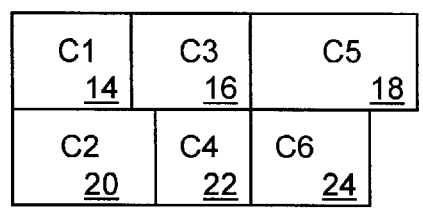
FIG. 2B
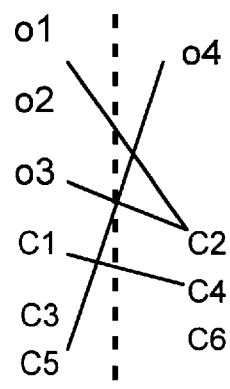 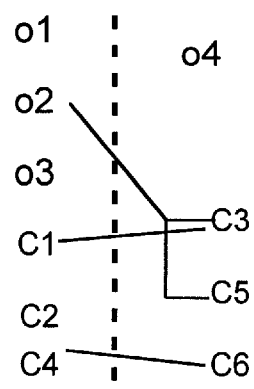
FIG. 2C        FIG. 2D a) partition level 1 b) partition level 2 c) partition level 3 d) partition level 4 e) global placement done f) final placement a) Design Hierarchy b) module d: datapath module
with predetermined shape c) Trial Placement d) Placement Guiding Block
Based Floor Plan a) G(I) in floor plan b) partition level 1 c) partition level 2 d) partition level i

DESIGN HIERARCHY-BASED PLACEMENT

BACKGROUND OF THE INVENTION

1. Field of the Invention

The invention relates to integrated circuit design, and particularly to a system for determining the physical placement of a hierarchically designed circuit within an integrated circuit.

2. Description of Background Art

A conventional integrated circuit design process includes two major steps: logic design, and physical design. During the logic design step, the design concept is ordinarily described using a hardware description language (HDL) to produce an HDL file. The HDL file is then converted into a netlist format describing set of logic gates, such as AND, OR, etc., and the interconnections between such gates. Many commercially available logic synthesis tools transform HDL files into netlist format.

During the physical design step, the manner in which gates and connections described in the netlist file are to be placed and routed is determined. Various placement algorithms attempt to optimize certain parameters relative to chip die size, wire length, timing, power consumption, or routing congestion. Once placement and routing are determined, mask information is generated for controlling integrated circuit (IC) production.

Before deep submicron circuit processing became available, gate delays dominated signal path delays in ICs. Hence circuit timing could be determined mostly by analyzing netlist gates or logic and it was not necessary to analyze the physical implementation (placement and routing) of the gates, cells, or circuits. Thus logic design and physical design could be effectively decoupled. However, with the advent of deep submicron circuit technology, and significantly shrinking device geometries, circuit timing and design considerations are increasingly dominated by interconnect delays. Given this emerging design paradigm shift, there is a need for providing improved linkage between logic design and physical design.

BRIEF DESCRIPTION OF THE DRAWINGS

FIGS. 2A–D illustrate representative circuits C1–C6 as interconnected schematically (FIG. 2A) and placed physically (FIG. 2B), and circuit partitions (FIGS. 2C, 2D) of representative design for possible treatment according to the present invention.

SUMMARY OF THE INVENTION

A system for placing a hierarchical logic circuit within a substrate area of an integrated circuit chip generates a trial placement initially assigning each cell of the circuit to a position within the substrate area in a manner that is biased towards clustering cells of the same logic module. The system then identifies a set of module core areas within the substrate area, each module core area corresponding to a separate one of the logic modules and encompassing assigned positions of cells of the corresponding logic module. The system then defines a set of rectangular guiding blocks, each corresponding to a separate one of the module core areas and being sized in relative proportion to its corresponding module core area. The guiding blocks are then distributed within said substrate area. A final placement is then performed in a manner that is biased towards positioning cells of each logic module in a vicinity of the guiding block corresponding to the logic module while satisfying said other placement criteria.

DETAILED DESCRIPTION OF THE PREFERRED EMBODIMENT

The preferred embodiment of the present invention is implemented as a computer program application, including associated data files and related program code, for execution on a conventional computer or other single or multiple processing facility coupled possibly to a network for distributed processing. The present inventive methodology may reside in an electronic design automation (EDA) software tool suite for prototype circuit and system definition and verification. Generally, the present invention links the logic design and physical design steps more tightly and naturally by using the design hierarchy as a guide when placing circuit components.

Figure 1A:
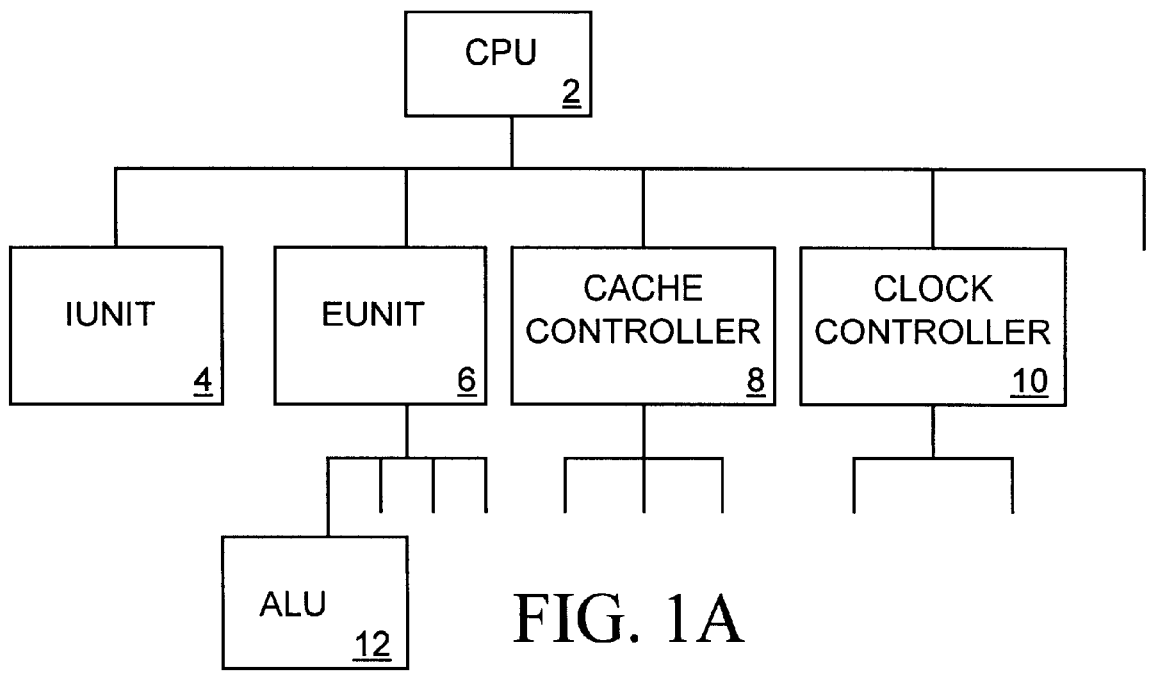
FIGS. 1A and 1B illustrate a representative CPU logic design as hierarchically arranged (FIG. 1A) and physically placed (FIG. 1B) for possible treatment according to the present invention.

FIG. 1A shows a sample hierarchical design wherein certain modules may be grouped according to their functional or timing requirements. The example design includes a central processor unit (CPU) system 2 having an instruction unit (Lunit) 4, an execution unit (EUnit) 6, and an arithmetic logic unit (ALU) 12, a cache controller 8, a clock controller 10, and possibly other components (not shown). A design hierarchy is useful for managing complex designs having digital or analog components because it encapsulates circuit functions hierarchically in various logic modules, During the design process, circuit resistance and capacitance (RC) characteristics of certain logic modules are normally predicted before actual placement and routing, typically using well-known "wire-load" modeling. A wire-load model comprises a table of statistical RC values indexed according to fan-out values derived from average interconnect wire length of nets forming each module size in terms of the number of gates in a net or the sum of the areas of cells forming the a net. Larger modules normally require longer average wire lengths. The wire-load model approach assumes that the cells forming a logic module are physically clustered together in the IC's substrate in a manner analogous to the way in which the logic design hierarchically groups cells according to logic module. However conventional placement algorithms typically optimize die size and/or total wire length and do not attempt to cluster cells in such manner. Thus cells of a logic module are likely to be distributed throughout a broad area of the substrate. Because circuit modules can be spread out, the wire-load model must be overly pessimistic when predicting resistance and capacitances associated with the various modules. The placement system of the present invention places cells belonging to same module close together in a manner reflecting the design hierarchy, thereby promoting "locality" of placement.

Figure 1B:
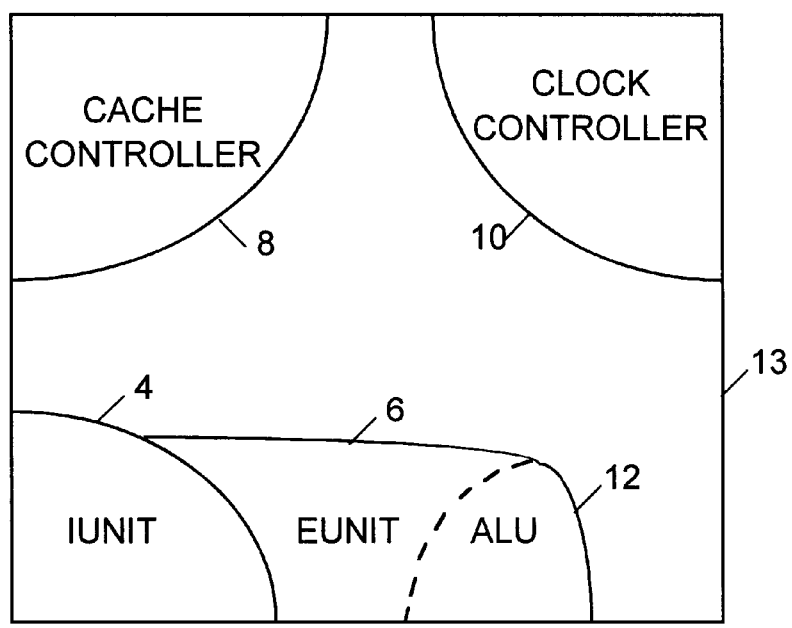

FIG. 1B illustrates an example placement 3 of system circuit components 4, 6, 8, 10, 12 corresponding to the hierarchical design definition illustrated in FIG. 1A. With such hierarchically-based placement, cells of a logic module are clustered together so that the wire-load model approach more accurately predicts timing and power consumption. This helps the designer to optimize design decisions at logic design stage.

The design hierarchy-based placement system of the present invention enables more natural linkage between the logical and physical design steps, particularly with respect to estimating cell driven strength and predicting interconnect delays. It also facilitates design changes by allowing replacement of a changed design module (i.e., re-synthesis) without disturbing the floorplan of the placement. The invention also employs a design hierarchy-based placement area slack distribution algorithm, a row-improvement technique, and a randomization scheme are described herein for systematically and efficiently predicting and resolving global routing congestion. The system places cell instances belonging to the same or associated logic modules in relatively close proximity naturally while optimizing various placement criteria.

An approximate size and shape of each module is determined using a trial placement procedure. Placement outlines (guiding blocks) for the modules based on these approximate module sizes and shapes are then appropriately distributed in the IC's placement area. During a final placement procedure cells forming the various circuit modules are placed in the vicinity of the guiding blocks. To optimize various placement criteria, the module placement outlines evolve recursively and are not limited to regular forms such as rectangles. The trial and final placement algorithms attempt to find the most natural and optimal way for placing each module. Visually, a placement area for a design hierarchy is divided into number of irregular areas, each associated with a separate design sub-hierarchy placement. Irregular areas may be further reduced to smaller irregular areas, each representing a child of such design sub-hierarchy placement. Thus the design considerations and the logic groupings captured in the logic design step are directly carried into the physical placement.

In addition to advantages in managing design complexity and faster timing convergence, placement with hierarchically-based locality provides power and die size optimization opportunities. Key characteristics enabling optimization include for each module, minimization of wire lengths, and low fan-out. Shorter wire lengths for module internal signals or low fan-out signals provide an opportunity to reduce cell driving strengths for module internal cells and this translates into a reduction in overall power consumption and die size.

Some conventional algorithms rely on externally generated placement constraints to produce better placement locality, but these result in sub-optimal solutions including longer wire length, much longer computational times. Performance deteriorates very quickly when placement algorithm is overly constrained. By using the hierarchy-based placement algorithm of the present invention which produces locality of placement without overly constraining placement, placement locality is achieved naturally, in tandem with optimizing total wire length and chip die size.

FIGS. 2A and 2B provide a representative circuit interconnect model and a possible corresponding circuit placement, respectively. Initially, a system, chip or circuit design or other general definition is received in conventional file format, such as schematic netlist, as illustrated in FIG. 2A, for eventual feasible physical placement on a semiconductor substrate, as shown in FIG. 2B. "Feasible physical placement" is defined as a placement that is routable and which provides correct signal timing. For instance, given list of circuits (C1, C2, . . . CN), input/output (01, 02, . . . ON), interconnects (N1, N2, . . . NM), and size of circuits $S(c_i)$ produce legal placement for circuit. The sample circuit design includes interconnected components C1 14, C2 20, C3 16, C4 22, C5 18, C6 24, as well as signal lines or pins 01, 02, 03, 04.

The global placement process performs multiple levels of partitioning of the design. At each level of partitioning, sets of cell instances is partitioned suitably into two (or more) partitions, Pi and Pj. The partitioning algorithm minimizes signal crossings C(P) between the two partitions while attempting to keep size of two partitions S(Pi) and S(Pj) balanced, i.e., S(Pi)=S(Pj). To partition sets of components, the partitioning system of the present invention creates an initial "seed" partition, then uses a conventional partition heuristics algorithm such as one of the so-called KLFM (Kernighan, Lin, Fiduccia and Mattheyses), LA (Look-ahead), CLIP (Cluster-oriented iterative-improvement partitioner), ratio cuts methods to improve the partition objective C(P) by relocating cells between partitions. FIGS. 2C–D show an initial seed partition and a "best" partition thereafter produced by a partition heuristics algorithm. Note that Pinitial C(P)=5, and Pbest C(P)=3. Empirical data shows that cell positions in the final partition result of a partition heuristics algorithm are sensitive to the manner in which the initial seed partition is selected. That is, the final placement of a cell is biased, though not restricted, towards its initial placement in the seed partition. The preferred embodiment of the invention employs a "divide-and-conquer" approach using alternating horizontal and vertical cut that recursively partitions the circuit down to a desired size of square of a global placement grid. As the partition level grows finer, cell instances are placed in progressively smaller areas.

Figure 3A:
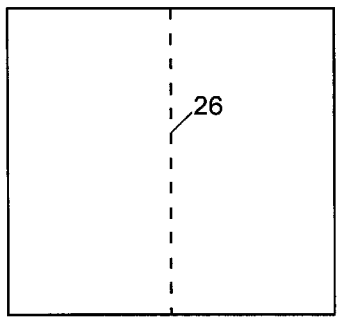
FIGS. 3A–F illustrate a representative divide-and-conquer placement sequence according to the present invention.
Figure 3B:
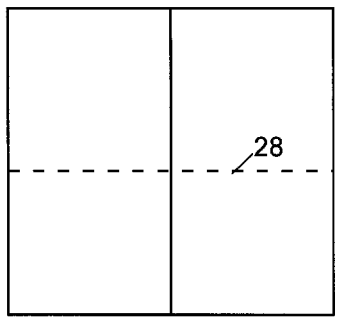
Figure 3C:
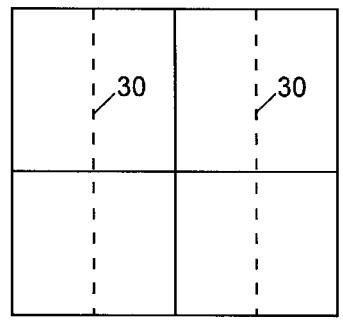
Figure 3D:
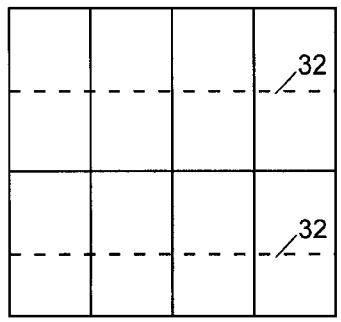
Figure 3E:
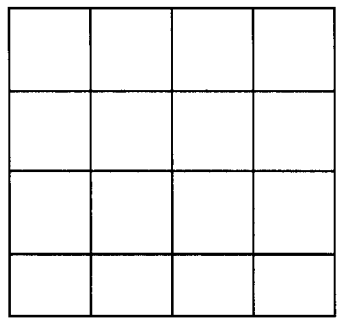
Figure 3F:
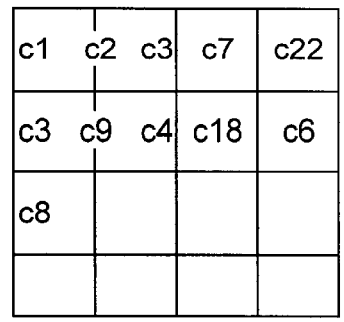

FIGS. 3A–F illustrate steps of global placement through such multi-level, divide-and-conquer partitioning. At each level partitioning, the design hierarchy-based algorithm uses the design hierarchy as base for developing sets of possible seed partitions for the placement algorithm. The system makes an initial partitioning cut line 26 as shown in FIG. 3A for partitioning level 1, FIG. 3B shows a second level (horizontal) partitioning cut line 28 resulting in four partitions. FIG. 3C shows a third level (vertical) partitioning via cut line 30 providing eight partitions. Then FIG. 3D shows a fourth level (horizontal) partitioning via cut line 32 providing sixteen partitions. The partitioning sequence continues until global placement is complete, as shown in FIG. 3E, and final component or circuit placement is accomplished, as shown in FIG. 3F.

At each partitioning level, an initial seed partition of the modules within an area to be partition is selected in a way to keep intact as many modules of the highest possible level of the logic hierarchy. A conventional heuristic placement algorithm is then employed to improve the seed partitioning by moving cells between partitions. The partitioning process is repeated several times at each partitioning level using a different seed partition for each repetition. However each seed partition is designed so that at most only one design module of the highest possible hierarchy level is partitioned. This helps to bias the heuristic placement algorithm towards clustering cells in a manner reflecting the design hierarchy. The best result in terms of placement die size or total wire length objectives is then saved as the result for the partition level. The circuit placement is then partitioned again, and the processes repeated.

Thus during the recursive partitioning process, the design hierarchy is continually considered after each successive partitioning to provide a seed partition that is biased toward grouping cells according to the design hierarchy. While this approach allows modules to take irregular shapes in placement for optimizing wire length and die size. the cells forming each design module tend to gravitate in placement toward one another to form a corresponding "module core area" in which most cells of the module are tightly clustered.

Figure 4:
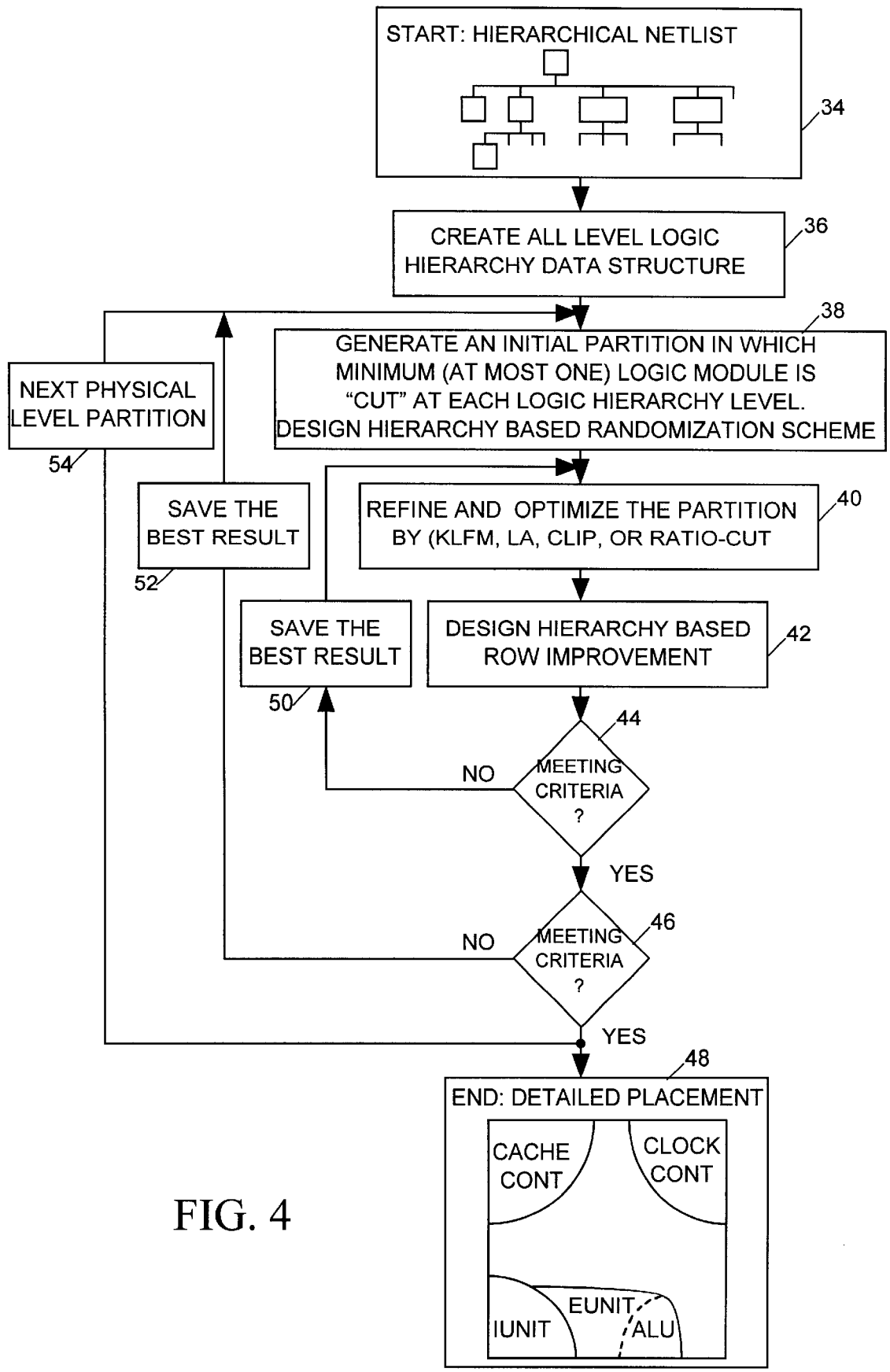
FIG. 4 shows flowchart of a hierarchy-based placement algorithm according to the present invention.

FIG. 4 is a flow chart illustrating a hierarchy-based placement algorithm that generates a desired detailed placement at step 48 starting with a hierarchical netlist provided at step 34. In doing so, the net list is converted into a first, unpartitioned, "all level logic hierarchy data structure" (step 36). Then an initial seed partition is established in which at most only one logical module at each level of the design hierarchy is partitioned (step 38). The particular modules at each level that are partitioned are chosen randomly in a manner described herein below.

Next the partitioning system refines and optimizes the partition using a conventional heuristic algorithm, such as the KLFM, LA, CLIP or ratio-cut systems (step 42). Then a design hierarchy-based row improvement routine is performed (step 42) also as described herein below to improve placement of cells on a row-by-row basis.

The system then determines whether the placement meets various criteria (steps 44 and 46), with best results being saved at steps 50, 52 respectively. Steps 38–52 are iteratively repeated for each physical level partition (step 54) until an optimal detailed placement is achieved (step 48). During each pass through step 38 a new initial (seed) partition for the partitioning heuristic (step 40) with the particular modules to be partitioned being randomly chosen. Optionally, related rows of circuit design are similarly processed by generating a hierarchy-based seed partition for the algorithm that optimizes row placement at step 42. Preferably, the circuit design is recursively horizontally and vertically partitioned until the average number of cells partitioned in each section is less than a defined threshold value, e.g. 100. Further refinement of the placement continues more exactly, for example, to adjust actual component locations to avoid overlaps.

Related rows of the circuit design are processed using am equivalent randomized seed partitioning based on the logic hierarchy. Related or functionally associated partitions or placement rows are recognized, so as to warrant common or combined initial partitioning according to the same logic hierarchy. Related rows include neighboring partitioned portions sharing co-linear partition cut-lines that are more likely to contain functionally related circuits. Unrelated rows are processed separately without combining circuits to obtain a seed partition, since they are unlikely to have functionally related circuits.

For example, rows are aligned vertically with neighboring sections deemed related rows for purposes of providing an initial seed partition, thereby providing improved pre-placement partitioning results. For further illustration, related-row processing. is presented in following pseudo code:

```
Do 10 times:
   seed initial partition of row according to logic hierarchy
      for each section in row:
      apply partition algorithm
   endfor
   obtain best result
end do
```

Additionally, following refinement, the code may provide improved placement result:

```
Do 5 times:
   for each section in row:
      save original result for section
      apply partition algorithm
      if (better result) then save result for section
         else restore original result for section
   end for
   save result <result should always be equal or better>
   if (no more improvement) exit
end
```

The placement system of the present invention provides a systematic solution to a global congestion problem arising from placement routability limitations by allocating placement area slack to hierarchical modules according to each module's interconnect characteristics. Given a circuit design having different types of functional units, e.g., control logic module and register file module, there may be a wide variation in interconnection density, the placement system provides an effective way to distribute routing resources.

Figure 5A:
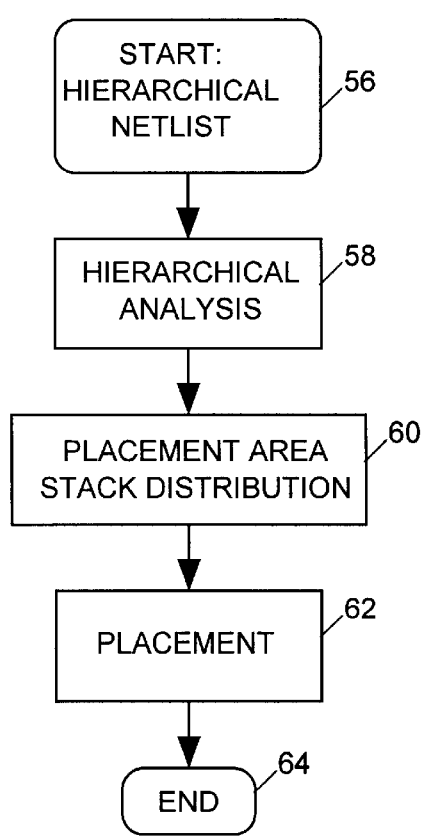
FIGS. 5A–B show flowcharts of design hierarchy-based placement area slack distribution algorithm according to the present invention.
Figure 5A:
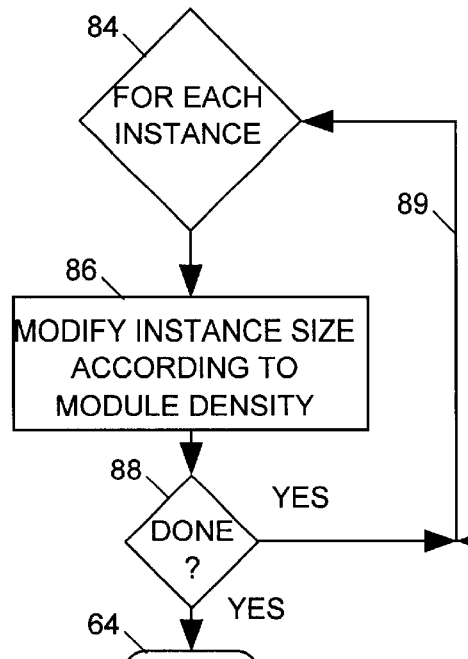
Figure 5B:
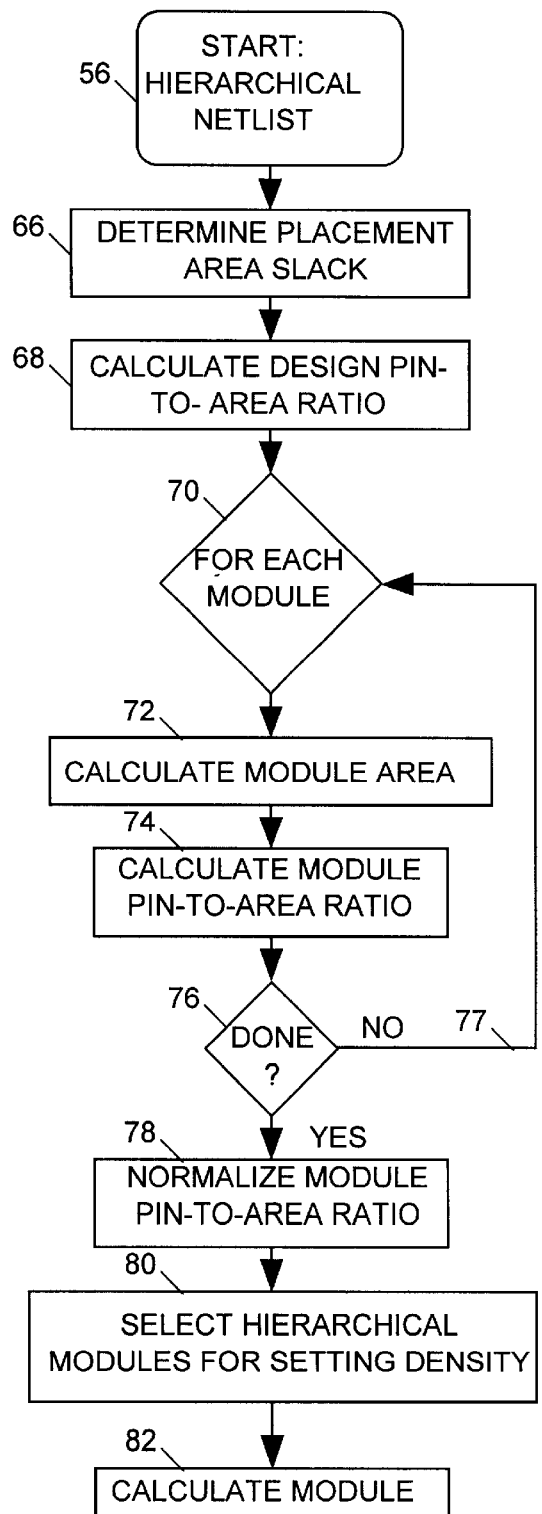

FIGS. 5A–B are flow charts illustrating a design hierarchy-based placement area slack distribution process in accordance with the invention. FIG. 5A shows major steps of the process. A hierarchical netlist or other similar file input is initially received (step 56). Then, a hierarchical analysis 58 is performed on the netlist to create data structures representing the various levels of hierarchy in the design. With such hierarchical data representation created, a placement area slack distribution step (60) calculates an appropriate placement density for each hierarchical module. The algorithm then distributes placement area slack according to module density (step 62).

As illustrated in more detail in FIG. 5B, the slack distribution algorithm calculates the density for each hierarchical module based on the logic netlist. With calculated module placement density, cell instance sizes are adjusted for placement formulation purposes on a hierarchical module basis to achieve a desired placement density for each module. Instance size is modified according to module density. Accordingly, the slack distribution algorithm provides advantageously that global routing congestion be determined based on logic connectivity before placement, not during or after placement. In this regard, formulation in calculating density and distribution is much simpler and more efficient and allows placement area slack or routing resources to be distributed to logic modules of the logic design hierarchy, and not to physical placement areas. This resolves global congestion in a systematic and effective manner. The system also smoothly distributes the placement area within each module by adjusting placement area for each instance according to module density to obtain a desired module density.

The slack distribution algorithm is described by following pseudo-code instructions:
Let:
  M(i) be module i,
  A(i) be area of module i;
  R(i) be pin-to-area ratio of module i,
  D(i) be placement density of module i,
  N(i) be number of instances in module i;
  S(i, N(i)) be leaf level instance cell sizes of module i,
Where:
  A module M(i) is defined to be sub-design or design itself
  M(O) representing top level
  A design is covered by a set of sub-designs, M(i) where I=1, 2 . . . n;
  A(i)=Sum (leaf level cell instance area of module i);
  R(i)=Sum (leaf level instance pin count of module i)IA(i);
  D(i)=A(i) allocated placement area for module I, Referring to FIG. 5B, given a hierarchy design netlist and chip size, the system perform the following steps, showing additional return loop-back steps:
1. Determine placement area slack: Slack=chip size−A(O) (step 66);
2. Calculate design pin-to-area ratio, R(O); (step 68)
3. Calculate module area, A(1) . . . A(n); (steps 70, 72)
4. Calculate module pin-to-area ratio, R(1) . . . R(n); (steps 74, 76, 77)
5. Normalize module pin-to-area ratio with design pin-to-area ratio to determine placement area allocation weight;, (steps 78, 80)
6. Calculate module placement density, D(i) . . . D(n) satisfying the equation: A(O)*D(O)=Sum (A(i)*D(i)), I=1, 2 . . . n; (step 82)
7. Modify the placement area slack for each leaf level instance in M(1) . . . M(n) based on D(1) . . . D(n) with instance width for instance j in module I set to be: S'(i,N(i))=S(i, N(i)) ID(i); (steps 84, 86, 88, 89)
8. Adjust each leaf level instance size for placement purposes according to S'(i, N(i)), I=1 . . . n.

The cell instance placement areas are modified according to module density to provide improved placement area slack (global routing resource) distributions. The placement algorithm attempts to spread instances as evenly as possible, by balancing criteria used by during partitioning. If the target instance size (Target_lo) used by balancing condition follows:

$$Target\_lo=Area\_Inst*(Area\_lo/(Area\_lo+Area\_hi)$$

such that:

$$Area\_inst=\text{total instance area of partition,}$$

$$Area\_lo=\text{total area of low side of partition,}$$

and $$Area\_hi=\text{total area of high side of partition.}$$

then the partitioning algorithm partitions instances with nearly equivalent density. An error is bounded by MAX inst_size for instances in partition. In particular, the difference in instance density of low and high sizes is bounded by following:

$$|Density\_lo=Density\_hi<=Error\_margin$$

such that:

$$Density\_lo=S\_lo/Area\_lo,$$

and $$Density\_hi=S\_hi/area\_hi,$$

and $$Error\_margin=2*MAX\ inst\_size/Min\ (Area\_10, Area\_hi).$$

By modifying placement area of instances from S(1) to S'*I), a desired module density is achieved.

For example, assuming design D includes three functional units, a, b, and c, and that A(a)=A(b)=A(c), then the area of the entire design is A(D)=A(a)+A(b)+A(c). Chip utilization D(D) is at 90%. The algorithm calculates pin-to-area ratios for design R(D)=6 and for modules R(a)=4, R(b)=6, and R(c)=8 from the logic netlist. The algorithm then uses the design pin-to-area ratio and density as a base for normalizing module pin-to-area ratios and calculates module density. The results are: D(a)=85%, D(b)=90%, and D(c)=95%. Cell instance sizes are then adjusted according to each module placement density.

Let Sa(Ci), Sb(Ci) and Sc(Ci) be cell instance sizes for instances in module a, b and c. Adjusted size Sa'(Ci), Sb'(Ci), and Sc'(Ci) area:

Sa'(Ci)=Sa(Ci)*100/85/=1, . . . all instances in module a;,
Sb'(Ci)=Sb(Ci)*100/90/=1, . . . all instances in module b;,
Sc'(Ci)=Sc(Ci)*100/95/=1, . . . all instances in module c;
Results may be verified by checking satisfactory condition of equation:

$$A(D)*D(D)=A(a)*D(a)+A(b)*D(b)+A(c)*D(c)$$

By plugging-in values, left side of above equation provides:

$$3*A(a)*90\%$$

and right side provides:

$$(A(a)*85\%+A(b)*90\%+A(c)*95\%)=A(a)*(85\%+90\%+95\%)=3*A(a)*90\%$$

Hence the left and right sides of such equation are equal. When areas for modules a, b, c are not equal, the calculation can be extended to include area weighting in the formulation.

Another aspect of the present invention pertains to generating a floorplan based on trial placement. Although floorplanning mechanisms are ordinarily used by chip designers to manage complex circuit designs and to control physical implementation, the locations and aspect ratios of standard cell modules are determined mostly based on inter-module connectivity and module size. This typical approach unfortunately lacks correlation between a defined floorplan and optimal and feasible placement solutions. Accordingly the prior approach over constrains placement so that it either does not produce an optimal placement or does not complete the placement task. Accordingly one aspect of present invention provides an improved floorplanning methodology.

Instead of using rectangular bounding boxes sized according to netlist-base estimates of module size, the present invention generates less rigid rectangular "placement guiding blocks" sized based on a trial placement. Being based on sizes of modules appearing in a trial placement rather than an estimated based on the netlist, the guideblocks more accurately reflect module size. Also While prior art "bounding box" systems require all cells of each module to be placed within a corresponding bounding box, in accordance with the present invention, only the "core" of a module, not necessarily all the cells of such module, need be placed in a guiding block. This approach allows improved relative module positioning and aspect ratios while providing more flexibility in detail placement. For datapath blocks or customized blocks, the best block locations are extracted from trial placement in the context of the entire design, and the exacted block shape is included in the floorplan. This method of generating a floorplan is particularly effective when used in connection with a placement engine employing a design hierarchy-based placement algorithm, as described herein.

Figures 6A, 6B:
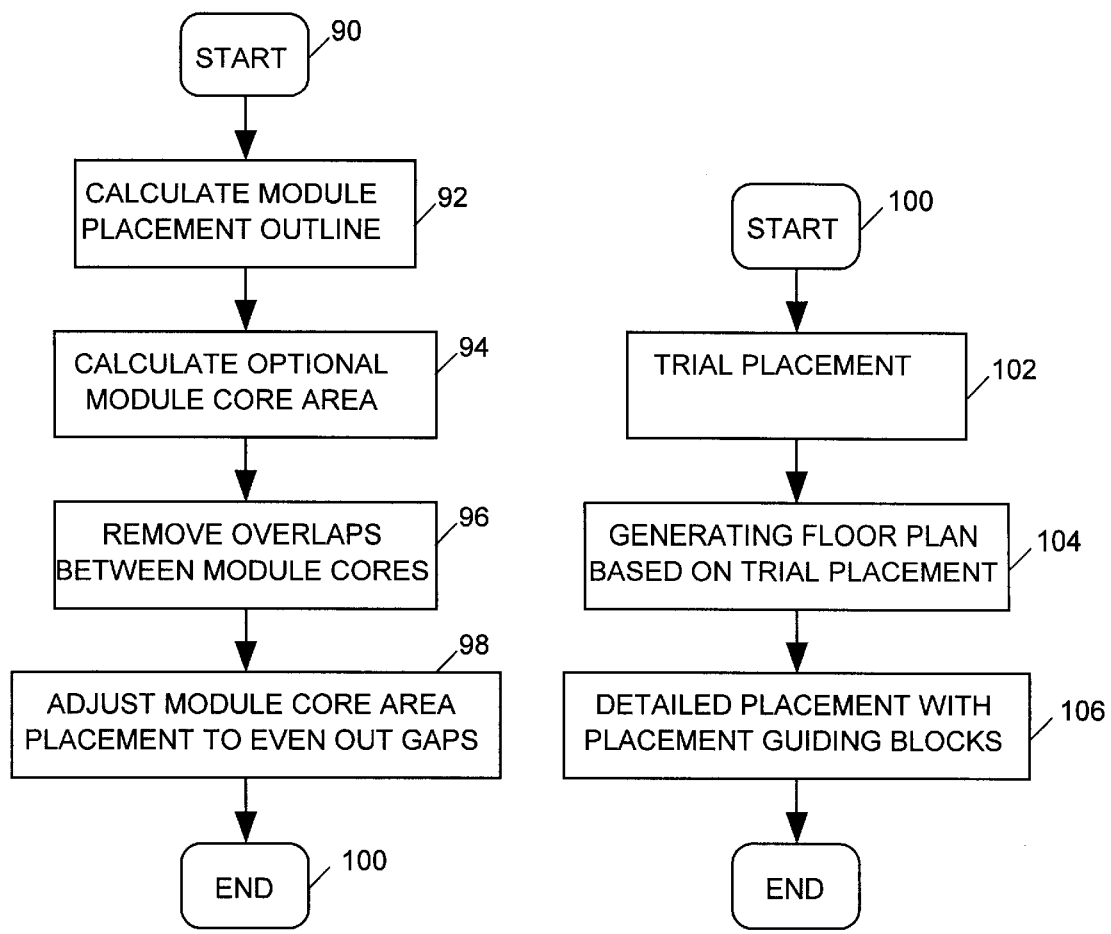
FIGS. 6A–B show flowcharts of methodology for generating a floorplan based on a trial placement algorithm (FIG. 6A) and a floorplan in a placement flow according to the present invention.

FIGS. 6A–B are flow charts illustrating a floorplanning process in accordance with the invention. Referring to FIG. 6B initially based on hierarchical netlist, the algorithm produces trial placement (step 102) that optimizes set placement objectives. Then based on the trial placement, the algorithm determines and optimal floorplan (step 104) as a set of placement guiding blocks for standard cells, locations of datapath blocks and customized blocks (step 106).

During the trial placement (step 102) placement is accomplished without using a floorplan. However since the placement process is biased toward clustering cells according to their position in the design hierarchy, outlines of core areas of modules naturally take shape at various locations in the placement area. These core areas may not be well-distributed in the trial placement, but the trial placement allows us to determine a size and an aspect ratio for each module and to determine relative module positions. This helps us to establish the size and relative positions of floorplan guiding blocks that are used in subsequent placement iterations.

As shown in more detail in FIG. 6A, the trial placement is first generated at step 102. The trial placement is then analyzed to determine for each module the largest contiguous outline of an area containing only cells of that module (step 92). A "module core area" is then determined as a rectangular box centering substantially around the module's outline. The size of module core area is adjusted to be a predetermined percentage of module's cell instance area (step 94). Once module core areas are determined, the core areas are repositioned to eliminate overlaps (step 96) and to adjust spacing (between module core areas (step 98). The module core areas then become guiding blocks in a floorplan for a subsequent placement iteration.

A preferred implementation of floorplan generation algorithm follows:
Let:
  M(i) be module i;
  A(i) be area of module i;
  C(i) be core area of module i;
  0(i) be cell instance placement outline of module i;
Where:
  A module M(i) is a sub-design of the design itself;
  M(O) represents the top level module;
  A design is a set of sub-designs, M(i) where i=1, 2 . . . n;
  A(i)=Sum (leaf level cell instance area of module i);
  0(i) is an outline of a module placement, including all cell instances in the module;
  C(i) a is maximum rectangular area within the largest contiguous piece of a module placement outline;
  P(i) is percentage of module core area with respect to module area, A(i);
  P(i)=M(i) core area size IA(i)*100%
Given detail placement:
1. Calculate module placement outline for each module 0(i) . . . 0(n);
2. Calculate an optimal module core area (rectangular or rectilinear shapes) for each module, C(1) . . . C(n);
3. Remove overlaps between C(1) . . . C(n);
4. Adjust placement of module core areas to even out gaps module core areas;
5. For given module, if percentage of module core area with respect to module area is less than a preset percentage, then module core area specification for that module is filtered out.

Figure 7:
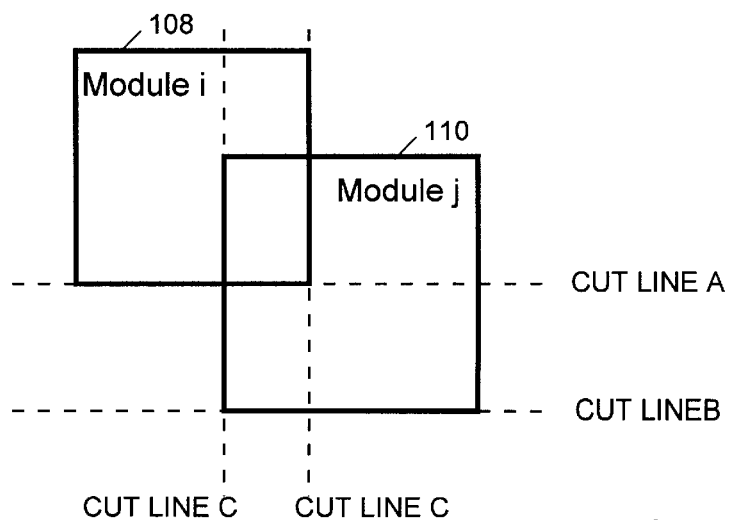
FIG. 7 is a representative diagram showing overlapping module core areas according to the present invention.

As a step in generating the floorplan, overlaps between module core areas are removed. Thus another aspect of present invention pertains to an algorithm or methodology for resolving module core area overlaps. A preferred algorithm follows. Given two module areas (C(i), Co)) that are overlapping 108, 110 as shown in FIG. 7:
1. Calculate P(i) and P(j);
2. Enumerate the bounded for cut lines (a, b, c, d) in removing overlaps for two overlapping module core areas i and j. For simplicity of illustration, assume such overlapping is removed following one of cut lines a, b, c, and d, as follows:
1. For a, b, c, d methods of removing overlap, calculate corresponding P(ik) and Pn(jk), where k=a, b, c, d
2. Find a set P(ik) and P(jk), k=a, b, c, d, such that: (P(i)−P(ik)+(P(j)−P(jk)) is minimum;
3. Select the corresponding module core area to be C(i) and C(j).

Another aspect of the invention pertains to using guide blocks for placement. A preferred implementation is as follows:
Let:
  M(i) be module i;
  G(i) be placement guiding block for module i;
  MS(i) be size of all cell instances module i with considering placement density;
  GS(i) be size of placement guiding block OC(i) be overflow cell;
  P(j) be partition at level i;
For given M(i) and G(i) in global placement process:
Case 1:
  At P(i) if it doesn't partition through G(i) then G(i) is placed on one side of partition line. Only abstraction of M(i) is visible to partition algorithm (i.e., its size) and all cell instances under M(i) does not participate in partition formulation at this level
Case 2:
  At P(i) if it partitions through G(i), then G1(i) and G2(i) area placed on different sides of partition line.
  M(i) is partitioned with same proportion as G1(i) and G2(i) subject to placement area feasibility.
Case 3:
  As partition level progresses, placement is confined to smaller grid area. At particular level of partition, when cell instances bounded by Gm(i) is greater than area of Gm(i), then that portion of M(i) is placed in its neighboring grids. Since typically G(i) is smaller than M(i), overflow cells, OC(i), area placed around G(i) in neighboring areas.

The placement guiding blocks are implemented as a floorplan, as follows:
1. Check floorplan feasibility;
2. Adjust for area feasibility to avoid local placement congestion; and
3. Perform placement with guidance from placement guiding blocks.

Figure 8:
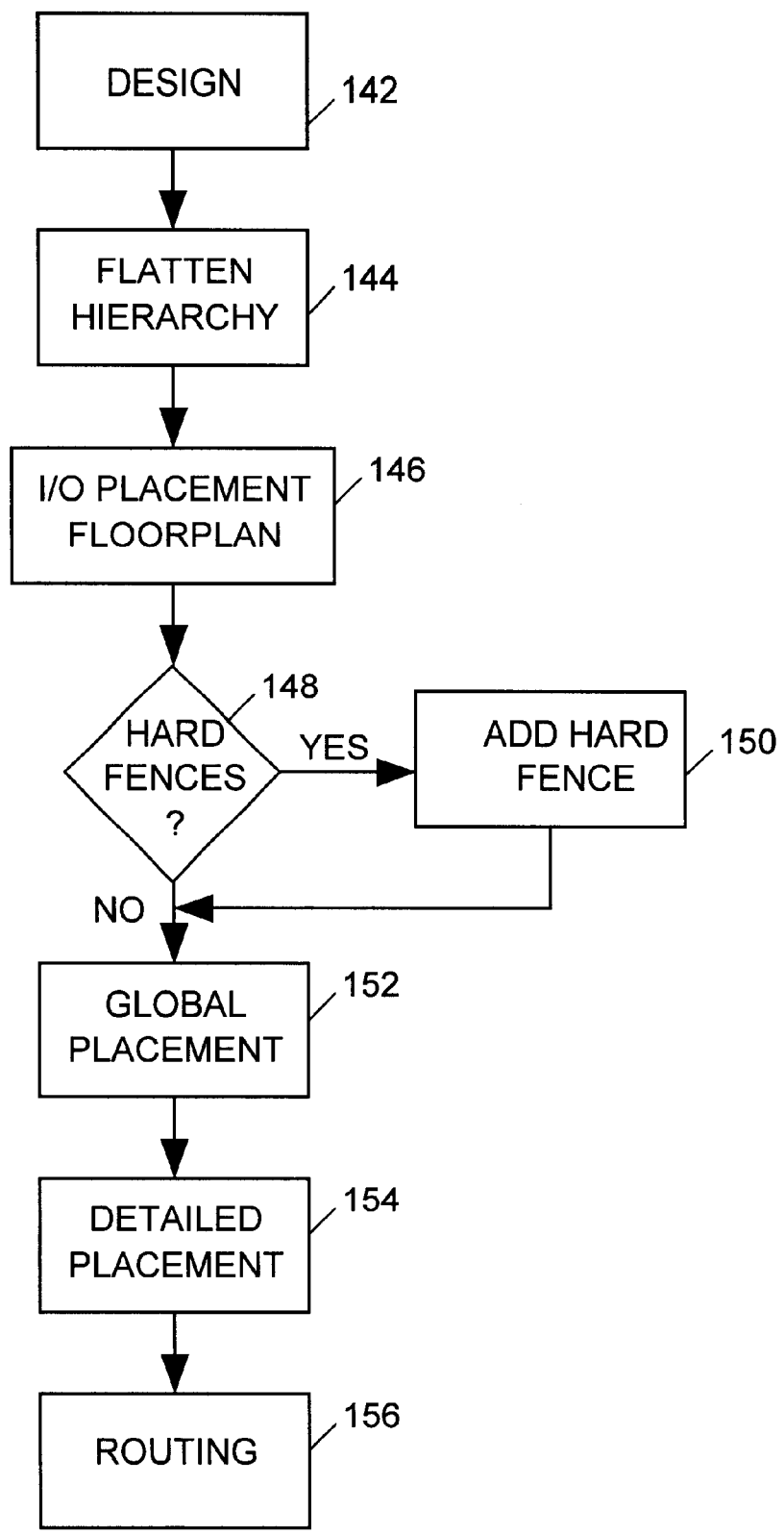
FIG. 8 illustrates top-level flow chart of a representative implementation according to the present invention.

FIG. 8 illustrates a top-level flow chart of a design hierarchy-driven placement methodology in accordance with a preferred embodiment of the invention. Initially, a netlist file describing the design is received (step 142) by EDA tools installed on a conventional engineering workstation or equivalent platform. The circuit design is then flattened (step 144) into instances. Next, input/output (I/O) pads are placed in fixed locations on chip substrate area, and an input floorplan is provided (step 146) preferably as boxes or other rectilinear areas where instances will be placed. The design is then checked for presence of hard fences (step 148). If hard fences appear, then the hard fences or other equivalent constraints as discussed herein are added (step 150). Otherwise, the process proceeds to a global or preliminary placement methodology (step 152), illustrated in further detail in the flow chart of FIG. 9. After global placement is completed, final or more detailed placement is performed (step 154), followed by routing of wire interconnect between circuit component and pins (step 156).

Figure 9:
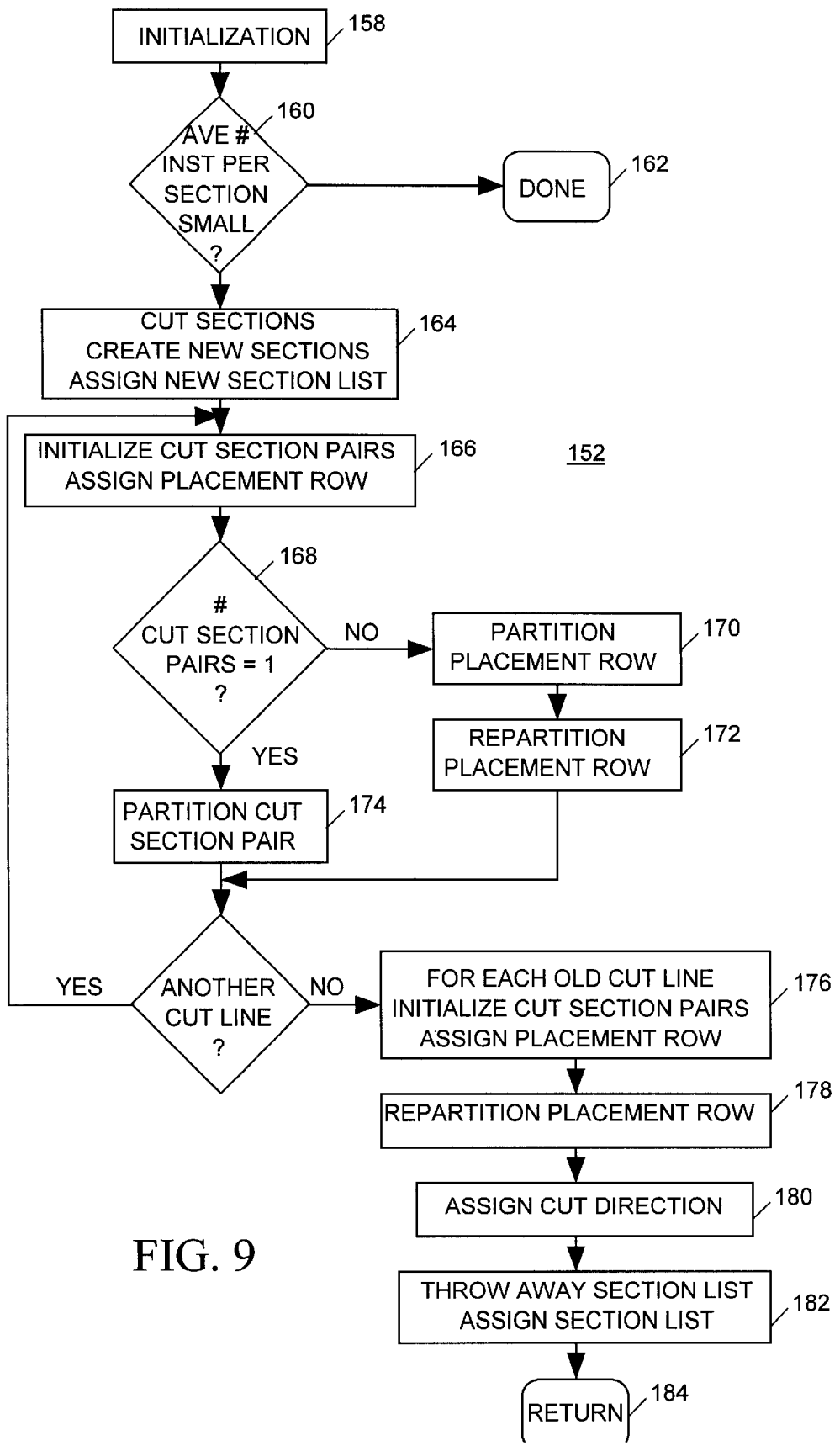
FIG. 9 illustrates the global placement methodology included in FIG. 8 according to the present invention.

FIG. 9 illustrates the global placement step 152 of FIG. 8 in more detail. An initialization step 158 includes assigning a top section (i.e., an input floorplan and any instances), establishing a section list, and a cut direction (horizontal or vertical). The algorithm then determines whether average number of instances per section in section list is relatively small, preferably according to predetermined comparison value (step 160). If so global placement ends (step 162). Otherwise the algorithm cuts in the sections on the list in half creating new sections and assigns a new section list (step 164).

Then, for each cut line (i.e., for each placement row), the algorithm initializes cut section pairs (i.e., low section and high section as cut section pair) and assign placement row list of cut section pairs (step 166). Next the algorithm determines whether a number of cut section pairs equals one (step 168). If not, then the placement row is partitioned by initially instances to low sections and high sections as well as possible (step 170). The algorithm then re-partitions the placement row by reassigning cell instances to low and high sections when possible to better satisfy cell placement criteria. Otherwise, if the number of cut sections pairs equals one (step 168), then the algorithm proceeds to step 174 where it partitions cut section pairs. The process for each cut line ends at this point.

Next, for each old cut line between new cut lines, the algorithm initializes cut section pairs (i.e., assigns high section and low section, sections from new section list, to the cut pair), and assigns the placement row (step 176).

The algorithm then (step 178) re-partitions the placement row, reassigning cell instances to low sections and high sections when helpful to better meet placement criteria. An orthogonal cut direction is then assigned (step 180), the second list is discarded and a new second list is assigned (step 182) Finally (step 184) the algorithm returns to the beginning of the flow chart, step 158.

Figure 10:
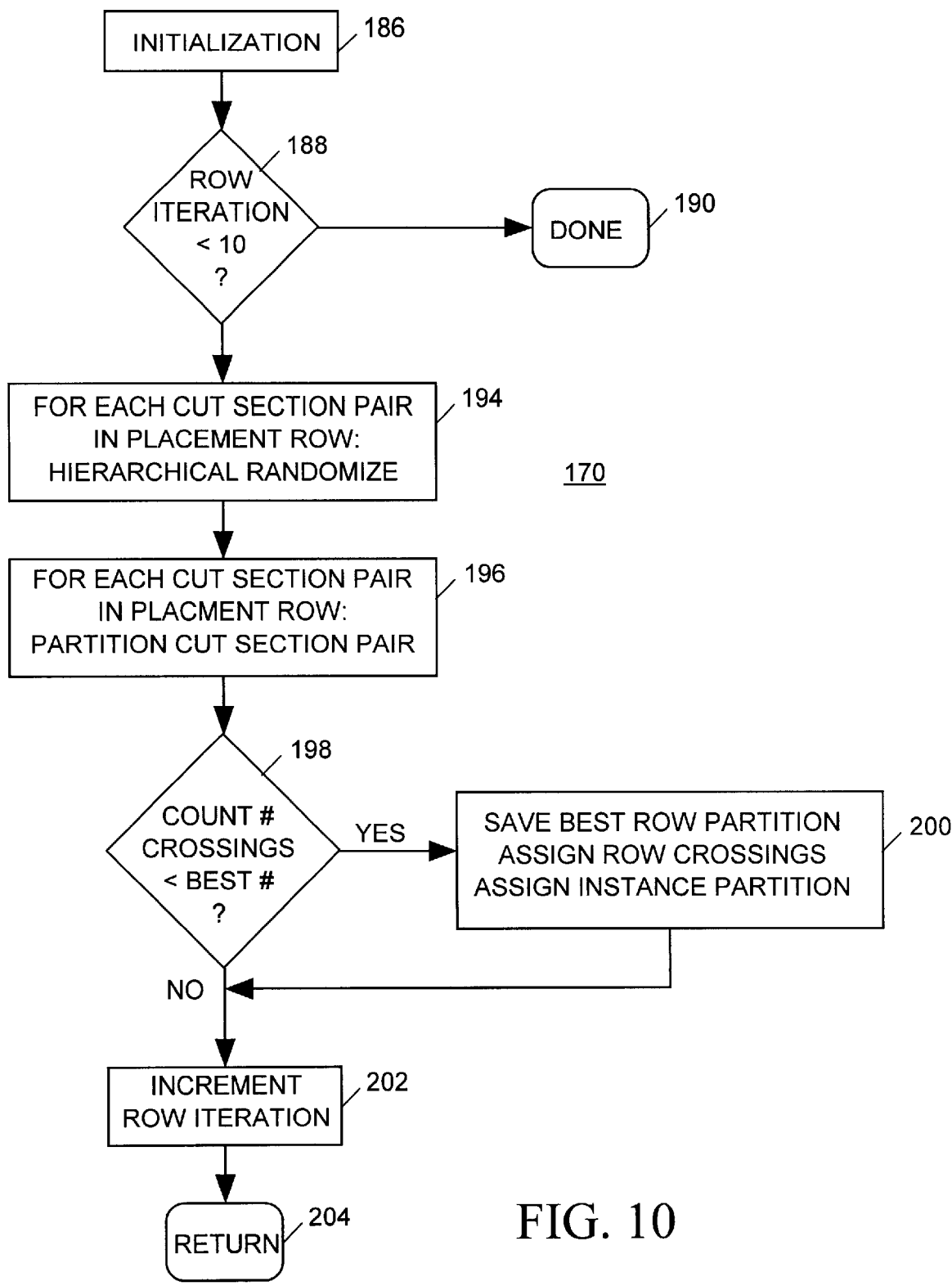
FIG. 10 illustrates a partition placement row methodology included in FIG. 9 according to the present invention.

FIG. 10 illustrates details of step 170 of FIG. 9. Initialization 186 includes assigning a value one to a row iteration variable and a value 1,000,000 to "best # of row crossings" variable. Also, for each section in the new section list, the algorithm assigns a best instance partition (e.g., none). Then (step 188) the algorithm determines whether the row iteration variable is less than 10; if not, then the algorithm terminates (step 190). Other its proceeds to a hierarchical randomize step 194. For each cut section pair placement row, instances are assigned to low or high sections in the cut section pair in "hierarchically random" fashion as described in more detail below. Then, for each cut section pair in placement row, perform partition cut section pair (step 196).

When the count number of crossings for entire placement row is smaller than best number of crossings (step 198) the algorithm saves the best row partition, sets the current number of row crossings to the best number of row crossings, and (for each section in new section list), assigns the current instance partition to the best instance partition (step 200) After step 200, or after set 198 if the current number of row crossing is not smaller than the best number of row crossing, the algorithm increments the row iteration (step 202) Thereafter (step 204) the algorithm returns to beginning of the flow chart (step 186).

Figure 11:
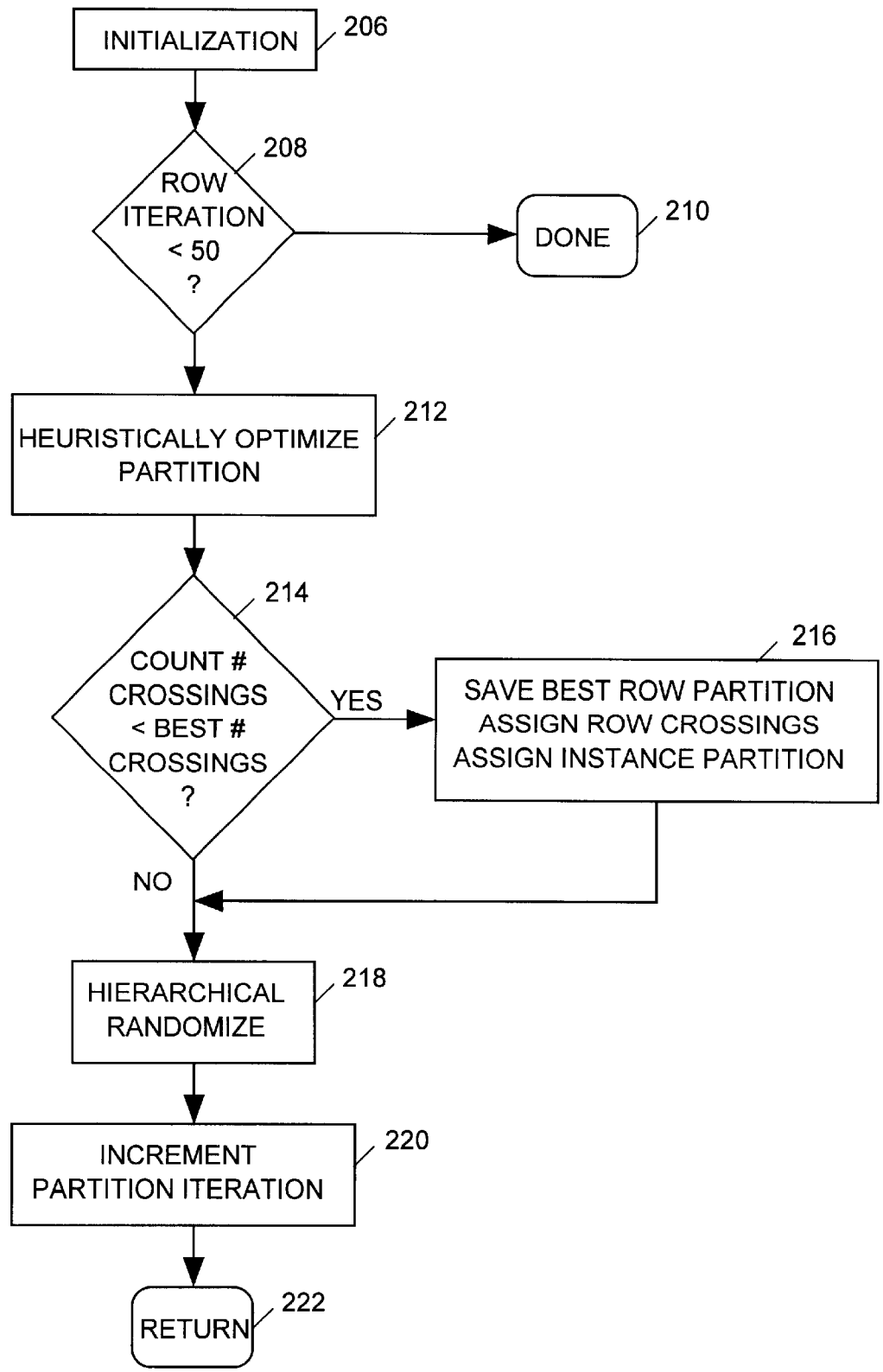
FIG. 11 illustrates the partition cut section pair methodology included in FIG. 10 and the methodology included in FIG. 9 according to the present invention.

FIG. 11 illustrates step 174 of FIG. 9 and step 196 of FIG. 10 in more detail. An initialization step 206 includes assigning a value of one to a partition iteration variable, counting the number of crossings for nets on instances in the cut section pair, assigning an initial number of crossings to a best number of crossings variable; and assigning an initial instance (seed) partition as the best instance partition. The initial partition of the cut section pair is preferably set by randomization or to the current best prior to the current procedure.

The algorithm then determines whether the partition iteration variable is less than 50 (step 208). If not, the algorithm terminates (step 210). Otherwise, the partition is heuristically optimized using a conventional partitioning algorithm such as KLFM, LA, CLIP, etc., using a randomized partition obtained earlier as initial seed (step 212). The algorithm then determines whether number of crossings for nets on instances in cut section pair is less than the best number of crossings (step 214). If so, the partition is saved as the best partition, the current number crossings is saved as the best number of crossings, and the current instance partition is saved as the best instance partition (step 216). After step 216 or step 214 when the counted number of crossing is no less then the previous best number, the partition is hierarchically randomize (step 218), the partition iteration variable is incremented (220) and the algorithm returns (step 222) to beginning step 206.

Figure 12:
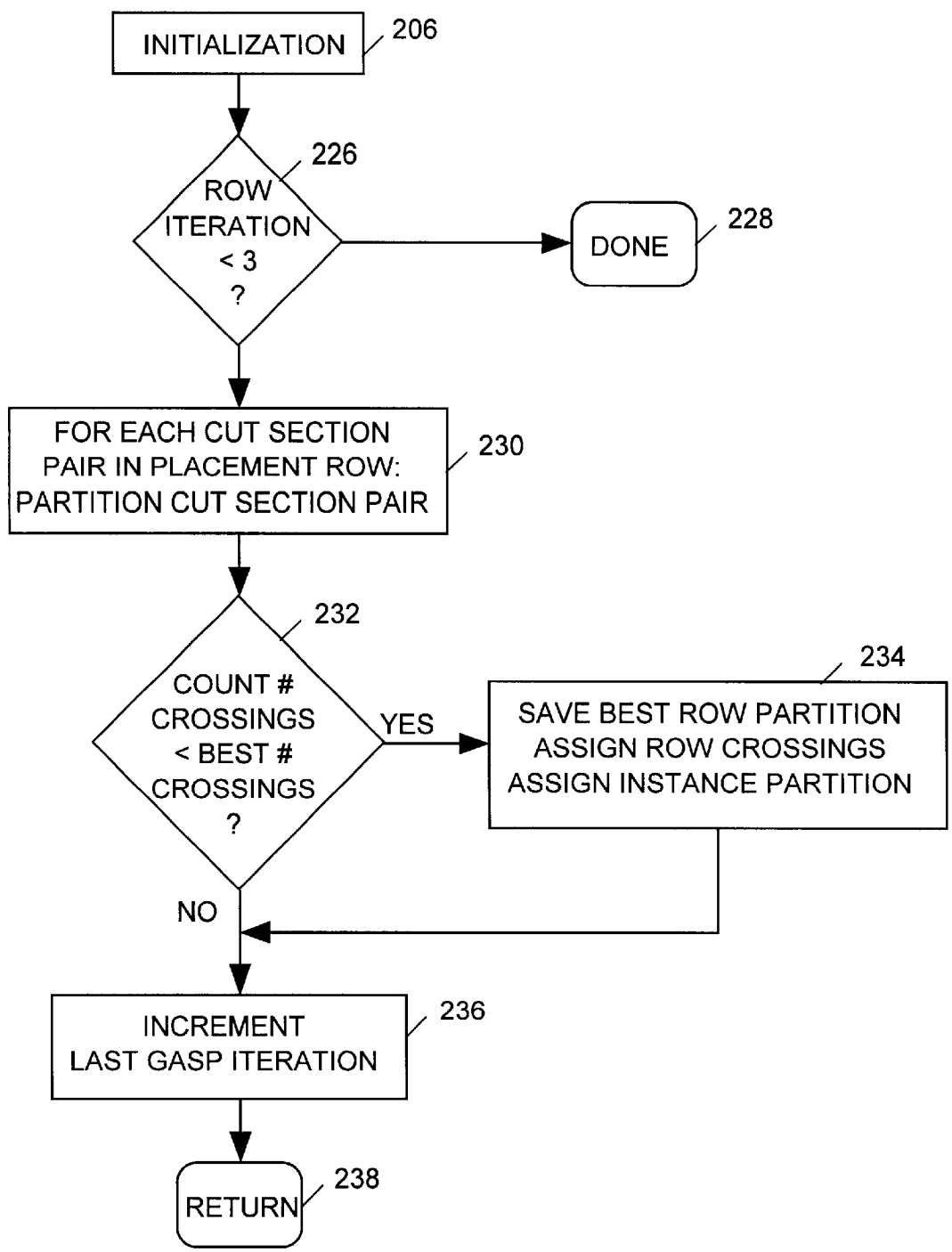
FIG. 12 illustrates re-partition placement row methodologies included in FIG. 9 according to the present invention.

FIG. 12 illustrates in more detail a subroutine for implementing the re-partition placement row employed in steps 172, 178 of FIG. 9. An initialization 224 includes assigning one to last gasp iteration variable; counting the number of crossing of nets on instances in the placement row, assigning the counted initial number of crossings to a best number of row crossings, and designating the initial instance partition as a best instance partition.

Next the routine determines whether last gasp iteration variable is less than three (step 226). If not, the routine terminates (step 228). Otherwise the routine proceeds for each cut section pair in placement row, to partition cut the section pair (step 230) and to determine whether the number of crossings is less than then value of the best number of crossings variable (step 232). If so the routine saves the partition as the best row partition, assigns the current number of row crossings as the best number of row crossings, and for each section in new section list, assigns the current instance partition to best instance partition (step 234) Next the routine increments the last gasp iteration variable (step 236), and returns (step 238) to the beginning of flow chart, step 224.

Figure 13:
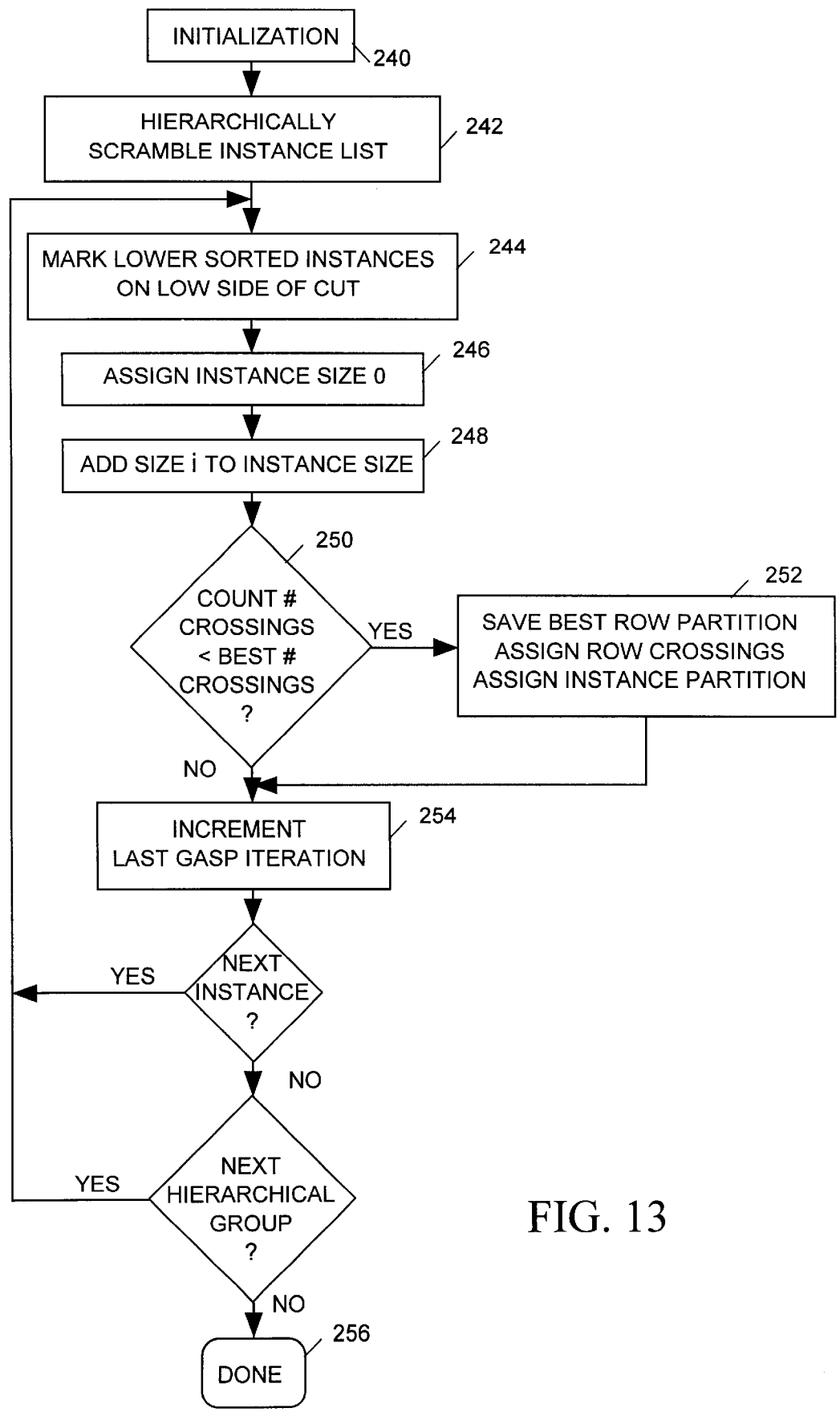
FIG. 13 illustrates hierarchically the randomizing cut section pair methodology included in FIG. 10 and the methodology included in FIG. 11.

FIG. 13 illustrates the hierarchically randomizing cut section step 194 of FIG. 10 and step 218 of FIG. 11 in more detail. An initialization step 240 includes extracting a partial design hierarchy containing instances in cut section pair and determining whether there are any hard fences. If there are hard fences, then during initialization hierarchies and instances are temporarily limited in any hard fence wholly contained in low or high side of a cut line. Otherwise the routine classifies the section pair into N+1 hierarchical groups, where N=number of hard fences that are active in current section pair (i.e., hard fences that cut across cut line that are in partial design hierarchy), Each of the first N groups contain an active hard fence and the remaining group (N+1) contains all other cells of the section pair. Note, N may be zero (i.e., there is always one hierarchical group). Also during initialization a target instance size of each hierarchical group is set equal to the size of instances in low side.

The routine then hierarchically scrambles each instance list in each hierarchical group (step 242). In doing so the routine does the following for each hierarchical group: initialize an empty sort instance list, set a root variable to the root of a hierarchical tree of the hierarchical group; recursively scramble each level of the hierarchical tree; and then place leaf cell instances in the cut section pair into the sort instance list according to their hierarchically scrambled order.

Next, for each hierarchical group, the routine marks lower sorted instances on low side of cut (step 244) and assigns zero to an instance size variable (step 246). Then for each instance i in the sort order in group, the routine adds the size of instance i to the instance size variable (step 248) and determine whether the instance size variable is less than target instance size of group (step 250). If so, instance i is assigned to the low side of cut. Otherwise instance i is assigned to the high side of the cut (step 252). The routine then ends (step 256).

Figure 14A:
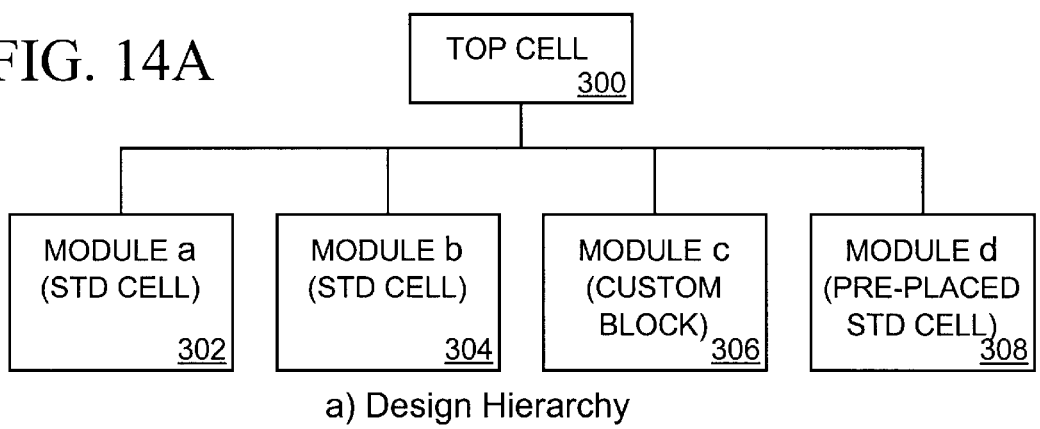
FIGS. 14A–D illustrate various hierarchical and placement diagrams showing a methodology for representative design to generate a floorplan based on a trial placement according to the present invention.
Figure 14B:
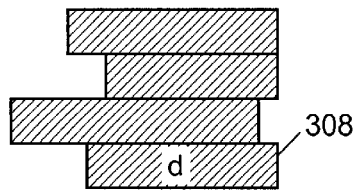

Referring to FIGS. 14A–D, a representative design is presented to illustrate the present invention for producing a desired placement floorplan from a hierarchical netlist. FIG. 14A shows a hierarchical design including a top cell 300 having a module a (standard cell) 302, a module b (standard cell) 304, a module c (custom block) 306, and a module d (pre-placed standard cell) 308. Module d 308 is a datapath block, as shown in FIG. 14B, having a shape that is predetermined either by a datapath compiler or by manual design.

During initial placement, the placement algorithm optimizes the placement objective functions when determining a placement for each of modules 302, 304, 306, 308 and instances under such modules. The datapath block module d 308 is prototyped using cell instances without finding optimal location of such module 308 in context of the design.

Figure 14C:
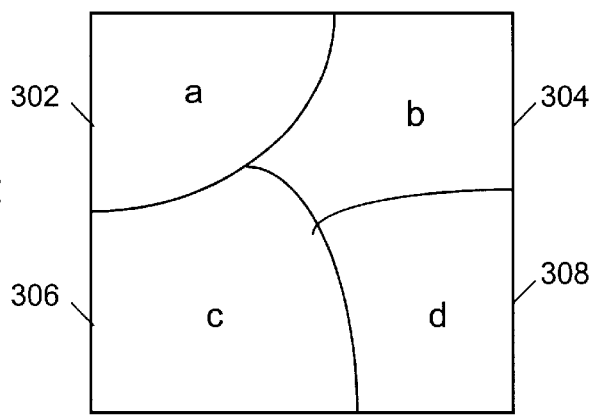
Figure 14D:
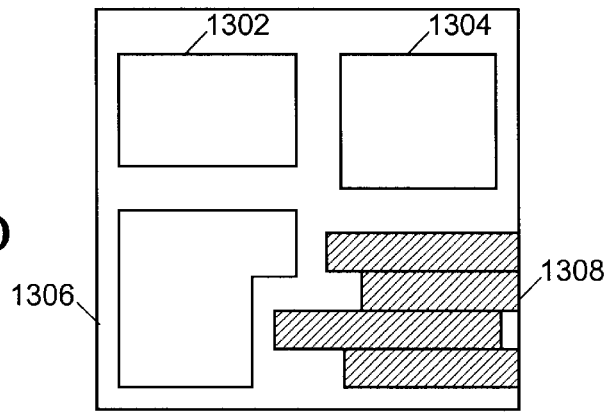

FIG. 14C illustrates a feasible or trial placement of modules 302, 304, 306, 308. Based on such trial placement, module locations are determined, and placement guiding blocks 1302, 1304, 1306, 1308 are calculated as shown in FIG. 14D. Here the actual shape of datapath block 308 or of any other block having a predetermined shape are put in floorplan. Such floorplan can then be used to guide final placement.

FIGS. 15A–D illustrate how the placement engine of the present invention makes use of placement guiding blocks. The placement area is divided into a number of global placement grids, and cells are placed within such grids through multilevels of partition.

Figure 15A:
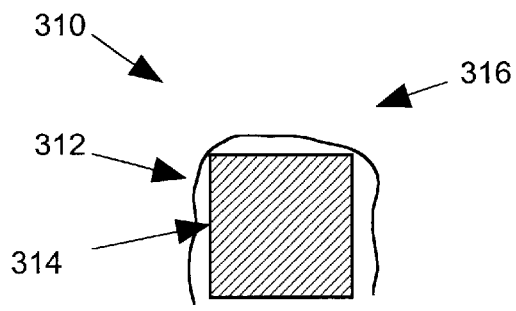
FIGS. 15A–D illustrate a set of placement diagrams for implementing guided placement using a placement guiding block according to the present invention.
Figure 15B:
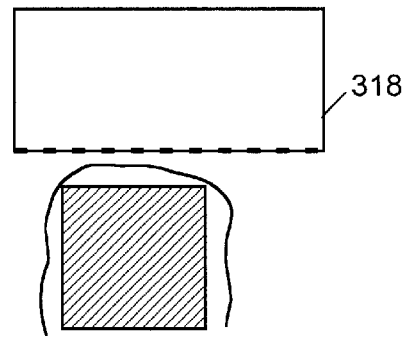

In FIG. 15A, a placement area 310 and a partition grid 316 are shown with a module placement outline 312 and a placement guiding block 314. In FIG. 15B, in a first level of partition 318, placement area 310 is cut in half along a horizontal cut line. Since the placement guiding block 314 is contained fully in the lower half of placement area, the corresponding logic module is placed in the lower half, and instances of the logic module are excluded from this level of partitioning.

Figure 15C:
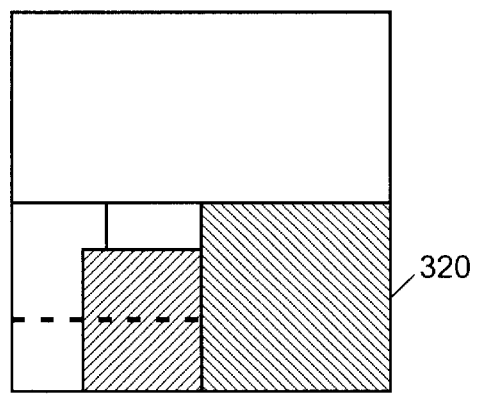

In FIG. 15C, at a level 2 partition 320, a vertical cut line divides placement guiding block 314 with 65% of the area of the block on the left of the cut line and 35% on right). Thus the corresponding module is partitioned roughly by 65% and 35%, with cells forming the module being placed on both sides of cut line. If the placement area on either side of the cut line is sufficient to allow each lower level module to be placed wholly within one of the two partitions according to such placement guiding block proportions, then the partition falls into Case 2, described above and no lower level modules are partitioned. Otherwise the partition algorithm considers placement area feasibility first and readjusts cell area proportions for the two partitions.

Figure 15D:
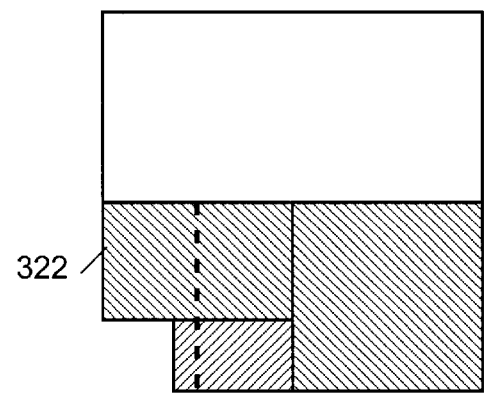

Referring to right side of the cut line as shown in FIG. 15C, such section is then further partitioned in FIG. 15D for level I. At each level of partition, area feasibility is checked accordingly. When the total cell area exceeds the designated placement area, then they are partitioned and expanded in the area neighboring the placement guiding block.

What is claimed is:

1. A method for determining placement of a circuit within a substrate area of an integrated circuit chip, wherein the circuit is defined as comprising a plurality of logic modules, each logic module including a plurality of cells, the circuit being further defined as comprising connections for carrying signals between said cells, the method comprising the steps of:

a. generating a trial placement by initially assigning each cell of said circuit to a position within the substrate area in a manner that is biased towards clustering cells of the same logic module while satisfying other positioning criteria;

b. identifying a plurality of module core areas within the substrate area, each module core area corresponding to a separate one of the logic modules and encompassing assigned positions of cells of the corresponding logic module;

c. defining a plurality of rectangular guiding blocks, each guiding block corresponding to a separate one of the module core areas and being sized relative to its corresponding module core area;

d. assigning each guiding block to a position within said substrate area; and e. generating a second placement by reassigning each cell of said circuit to a position within the substrate area in a manner that is biased towards positioning cells of each logic module in a vicinity of the guiding block corresponding to the logic module while satisfying said other positioning criteria.

2. The method in accordance with claim 1 further comprising the step of iteratively repeating steps b–e.

3. The method in accordance with claim 1 wherein step a comprises the substeps of:

a1. partitioning the substrate area into a plurality of first partitions; and a2. initially assigning cells of said circuit to positions within said first partitions in a manner that is biased towards clustering of cells included in each logic module within a same one of said first partitions.

4. The method in accordance with claim 3 wherein step a further comprises the step of:

a3. reassigning at least one of said cells to a new position within said substrate area so as to satisfy a placement criterion.

5. The method in accordance with claim 4 wherein for each of said plurality of first partitions, step a further comprises the substeps of:

a4. further partitioning said first partition into a plurality of second partitions; and a5. reassigning cells assigned at step a2 to positions within said first partition to positions within said second partitions in a manner that is biased towards clustering of cells included in each logic module within a same one of said second partitions.

6. The method in accordance with claim 5 further comprising the step of a6. reassigning cells assigned at step a5 to new positions within said substrate area so as to satisfy said other placement criteria.

7. The method in accordance with claim 1 wherein in step b, the module core area corresponding to each logic module is identified as a largest contiguous portion of said substrate area containing only cells included in the logic module.

8. The method in accordance with claim 1 wherein each guiding block defined in step c has a height and width of a similar ratio as a height and width of a minimum rectangular area encompassing its corresponding module core area.

9. The method in accordance with claim 1 wherein step c comprises the substeps of:

c1. defining said plurality of guiding blocks within the substrate area, each guiding block corresponding to a separate one of the module core areas, each guiding block defining a rectangular portion of the substrate area sized and positioned in relation to its corresponding module core area; and c2. adjusting dimensions and positions of said guiding blocks within the substrate area to reduce overlapping of guiding blocks.

10. The method in accordance-with claim 9 wherein the guiding block dimensions are adjusted in step c2 in relation to cell densities of the corresponding module core areas.

11. The method in accordance with claim 1 wherein step c comprises the substeps of:

c1. defining said plurality of guiding blocks within the substrate area, each guiding block corresponding to a separate one of the module core areas, each guiding block defining a rectangular portion of the substrate area sized and positioned in relation to its corresponding module core area; and c2. adjusting dimensions and positions of said guiding blocks within the substrate area to reduce overlapping of guiding blocks and to adjust spacing between guiding blocks.

12. The method in accordance with claim 1 wherein in step d the guiding block are assigned to non-overlapping positions within said substrate area.

13. A method for determining placement of a circuit within a substrate area of an integrated circuit chip, wherein the circuit is defined as comprising a plurality of logic modules, each logic module including a plurality of cells, the circuit being further defined as comprising connections for carrying signals between said cells, the method comprising the steps of:

a. partitioning the substrate area into N first partitions wherein N is an integer greater than 1;

b. identifying the cells included in each logic module and initially assigning the cells to positions within said first partitions such that at most N-1 of said plurality of logic modules are divided, wherein cells of a divided module are assigned to more than one of said first partitions, and such that all others of said logic modules are undivided, wherein all cells of an undivided logic module are assigned to only one of said first partitions; and c. reassigning at least one of said cells of the divided module to a new position within said substrate area so as to satisfy a placement criterion.

14. The method in accordance with claim 13 further comprising the steps of:

d. further partitioning each said first partition into M second partitions where M is an integer greater than 1; and e. identifying all cells included in each logic module and reassigning cells assigned at step c to positions within said first partition to positions within said second partitions such that at most M−1 of said plurality of logic modules are divided, wherein cells of a divided module are assigned to more than one of said second partitions, and such that all others of said logic modules are undivided, wherein all cells of an undivided logic module are assigned to only one of said second partitions.

15. The method in accordance with claim 14 further comprising the step of f. reassigning cells assigned at step e to new positions within said substrate area so as to satisfy a placement criterion.

* * * * *